(12) United States Patent
Chen et al.

(10) Patent No.: US 7,456,061 B2
(45) Date of Patent: Nov. 25, 2008

(54) METHOD TO REDUCE BORON PENETRATION IN A SIGE BIPOLAR DEVICE

(75) Inventors: Alan S. Chen, Windermere, FL (US); Mark Dyson, Singapore (SG); Nace M. Rossi, Singapore (SG); Ranbir Singh, Singapore (SG); Xiaojun Yuan, Singapore (SG)

(73) Assignee: Agere Systems Inc., Allentown, PA (US)

( * ) Notice: Subject to any disclaimer, the term of this patent is extended or adjusted under 35 U.S.C. 154(b) by 59 days.

(21) Appl. No.: 11/694,021

(22) Filed: Mar. 30, 2007

(65) Prior Publication Data

US 2008/0237642 A1   Oct. 2, 2008

(51) Int. Cl.
*H01L 21/8238* (2006.01)

(52) U.S. Cl. .............. 438/202; 438/207; 438/361; 257/E29.193

(58) Field of Classification Search ......... 438/199–209, 438/309–371; 257/E29, 193
See application file for complete search history.

(56) References Cited

U.S. PATENT DOCUMENTS

2005/0079691 A1* 4/2005 Kim et al. .................. 438/481

* cited by examiner

*Primary Examiner*—H. Jey Tsai (57) ABSTRACT

The invention, in one aspect, provides a method of manufacturing a semiconductor device. This aspect includes forming gate electrodes in a non-bipolar transistor region of a semiconductor substrate, placing a polysilicon layer over the gate electrodes in the non-bipolar transistor region and over the semiconductor substrate within a bipolar transistor region. A protective layer is formed over the polysilicon layer. The protective layer has a weight percent of hydrogen that is less than about 9% and is selective to silicon germanium (SiGe), such that SiGe does not form on the protective layer. This aspect further includes forming emitters for bipolar transistors in the bipolar transistor region, including forming a SiGe layer under a portion of the polysilicon layer.

13 Claims, 8 Drawing Sheets

METHOD TO REDUCE BORON PENETRATION IN A SIGE BIPOLAR DEVICE

TECHNICAL FIELD

The invention is directed, in general, to a method of manufacturing a semiconductor device and, more specifically, to a bipolar device and method to reduce boron penetration in non-bipolar devices that are fabricated on the same chip as a silicon/germanium SiGe bipolar device.

BACKGROUND

Optimization of semiconductor devices continues to be an important goal for the semiconductor industry. The continued miniaturization of semiconductor devices, such as bipolar transistors, presents ongoing challenges to semiconductor manufacturers in maintaining or improving that optimization while maintaining product yields and minimizing production time and costs. One such challenge resides in reducing boron penetration associated with bipolar transistors that are located on the same chip as standard CMOS transistors.

As performance requirements have continued to increase, leakage and threshold voltage concerns have become more important to semiconductor manufacturers and attention has begun to focus on how to decrease leakage and maintain threshold voltages. In some semiconductor device configurations, bipolar transistor and CMOS transistors are often located on the same chip and process flows are configured to achieve and integrated design flow to build both bipolar transistors and CMOS transistors on the same chip. In such instances, protective films, such as a polysilicon and nitride stack, are often deposited over the CMOS region to protect it from the fabrication processes used to build the bipolar transistors.

When constructing a bipolar device in a BICMOS process flow, the CMOS region needs to be protected. Conventional methods use a nitride film or a stack of polysilicon and nitride as protective layers. During the actual nitride deposition step and subsequent heat treatments, hydrogen can diffuse from the nitride film down through the PMOS poly gate and into the gate oxide, where it acts to terminate non-bridging silicon atoms. These terminations tend to be weaker bonds, allowing the boron to mover more easily through the oxide substitutionally. The result is boron penetration through the gate oxide and into the underlying silicon. This can cause device threshold to drop and negatively affect device performance. The problem of boron penetration has become more acute as the thickness of the gate oxides has decreased below 3.0 nm.

Accordingly, there is a need to provide a process and device by which boron penetration is reduced in the CMOS region.

SUMMARY

To address the above-discussed deficiencies, in one embodiment, there is provided a method of manufacturing a semiconductor device. This embodiment includes forming gate electrodes in a non-bipolar transistor region of a semiconductor substrate, placing a polysilicon layer over the gate electrodes in the non-bipolar transistor region and over the semiconductor substrate within a bipolar transistor region. A protective layer is formed over the polysilicon layer. The protective layer has a weight percent of hydrogen that is less than about 9% and is selective to silicon germanium (SiGe) deposition, such that SiGe does not form on the protective layer. This embodiment further includes forming emitters for bipolar transistors in the bipolar transistor region, including forming a SiGe layer under a portion of the polysilicon layer.

In another embodiment, a semiconductor device is provided that includes a bipolar transistor region, including bipolar transistors having a silicon/germanium (SiGe) layer located over a collector tub, a polysilicon layer located over the SiGe layer. A dielectric layer is located over the polysilicon layer, and a protective layer is located over the dielectric layer. The protective layer has a weight percent of hydrogen that is less than about 9% and is selective to silicon germanium (SiGe) deposition, such that SiGe does not form on the protective layer. This embodiment further includes forming emitters for bipolar transistors in the bipolar transistor region, including forming a SiGe layer under a portion of the polysilicon layer. The device further includes a non-bipolar transistor region that includes transistors having gate electrodes and source/drains associated therewith.

In another embodiment, there is provided a method of manufacturing a semiconductor device. This embodiment includes forming gate electrodes in a non-bipolar transistor region and over a semiconductor substrate, placing a polysilicon layer over the gate electrodes in the non-bipolar transistor region and over a bipolar transistor region of the semiconductor substrate. A dielectric layer is deposited over the polysilicon layer, and a protective layer is formed over the dielectric layer. The protective layer has a weight percent of hydrogen that is less than about 9% and is selective to silicon germanium (SiGe) deposition, such that SiGe does not form on the protective layer. A silicon/germanium (Si/Ge) layer is formed over a collector tub and under a portion of the polysilicon layer within the bipolar transistor region. An emitter layer for bipolar transistors in the bipolar transistor region is formed over the protective layer and the Si/Ge layer. The dielectric layer, the protective layer and the emitter layer are patterned, which includes removing the protective layer from the non-bipolar transistor region. The polysilicon layer is also patterned.

The foregoing has outlined certain embodiments so that those skilled in the art may better understand the detailed description that follows. Additional embodiments and features are described hereinafter that form the subject of the claims. Those skilled in the art should appreciate that they can readily use the disclosed conception and specific embodiment as a basis for designing or modifying other structures for carrying out the same purposes as set forth herein.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
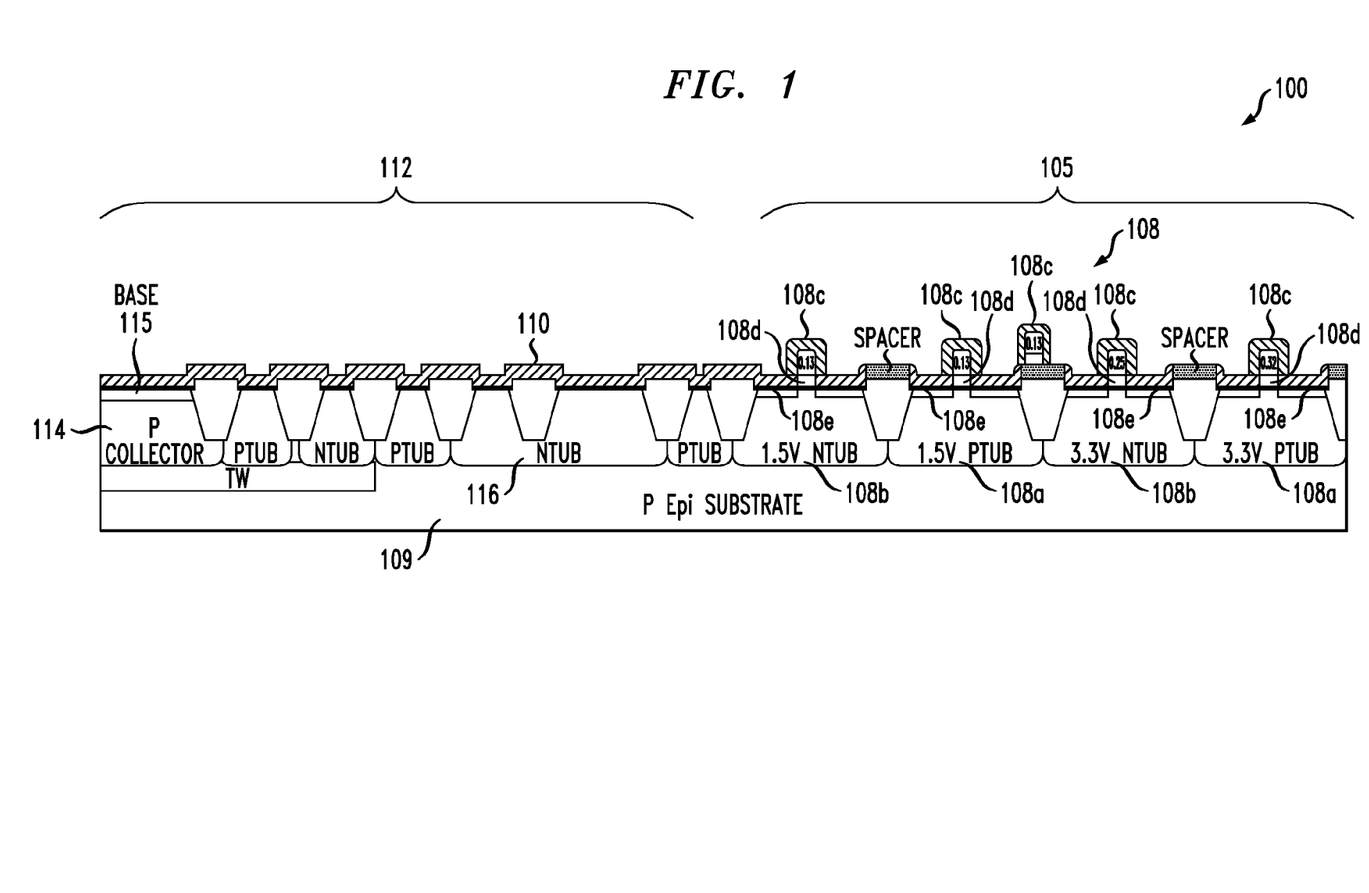
FIGS. 1-4 illustrate a semiconductor device as provided by one embodiment of the invention at various stages of manufacture, including the deposition of the protective layer.

FIG. 1 illustrates an embodiment of a semiconductor device 100 of the invention at an early stage of manufacture.

In this embodiment, the semiconductor device 100 includes a non-bipolar transistor region 105 comprising non-bipolar transistors 108 (e.g., PMOS or NMOS transistors that are not configured as bipolar devices) that are formed over a semiconductor substrate 109. The non-bipolar transistors 108 may be of conventional design, and they may be manufactured with conventional processes and materials known to those skilled in the art. In the illustrated embodiment, the transistors 108 are configured as CMOS devices. However, the transistors 108 may also be configured as all NMOS or PMOS devices. Moreover, it should be understood that though certain dopant schemes are shown and discussed herein, those skilled in the art will understand that they may be reversed or other dopant schemes may be used. In the illustrated embodiment, the transistors 108, which are configured as CMOS devices having different operating voltages, include PMOS tubs 108a and NMOS tubs 108b and other conventional features, such as gate electrodes 108c, which are isolated from an underlying channel region by a gate oxide 108d. The gate oxide layers 108d preferably have thicknesses that are less than about 2.5 nm. The device 100 also includes conventional source/drains 108e. The gate electrodes 108c are typically doped with a dopant to give the polysilicon the required conductivity. An oxide layer 110, which may also be conventionally formed, is located over the semiconductor substrate 109, as shown. The oxide layer 110 is subsequently patterned to form spacers for the gate electrodes 108c.

The semiconductor device 100 further includes a bipolar transistor region 112. At this stage of manufacture, a p-type collector tub 114 and base 115 for a PNP bipolar transistor and an n-type collector tub 116 for an NPN bipolar transistor have been conventionally formed in the semiconductor substrate 109. It should also be generally noted that, unless discussed otherwise herein, conventional processes, materials, and designs may be used to fabricate a completed semiconductor device.

Figure 2:
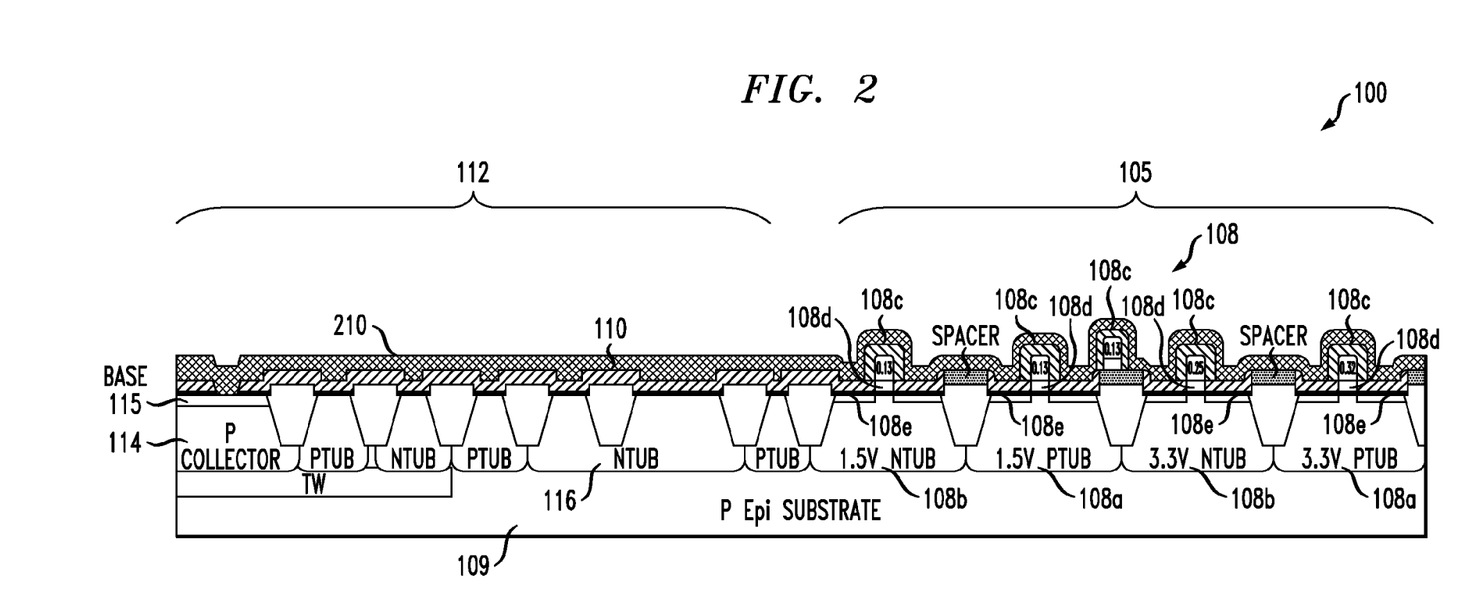

FIG. 2 illustrates the semiconductor device 100 of FIG. 1, following the formation of a polysilicon layer 210. Conventional processes and materials may be used to form the polysilicon layer 210 over the non-bipolar region 105 and the bipolar region 112. The polysilicon layer 210, which may be referred to as a base polysilicon layer, is later used to form electrodes for PNP and NPN bipolar transistors. The polysilicon layer 210 is implanted with a dopant to provide the appropriate conductivity.

Figure 3:
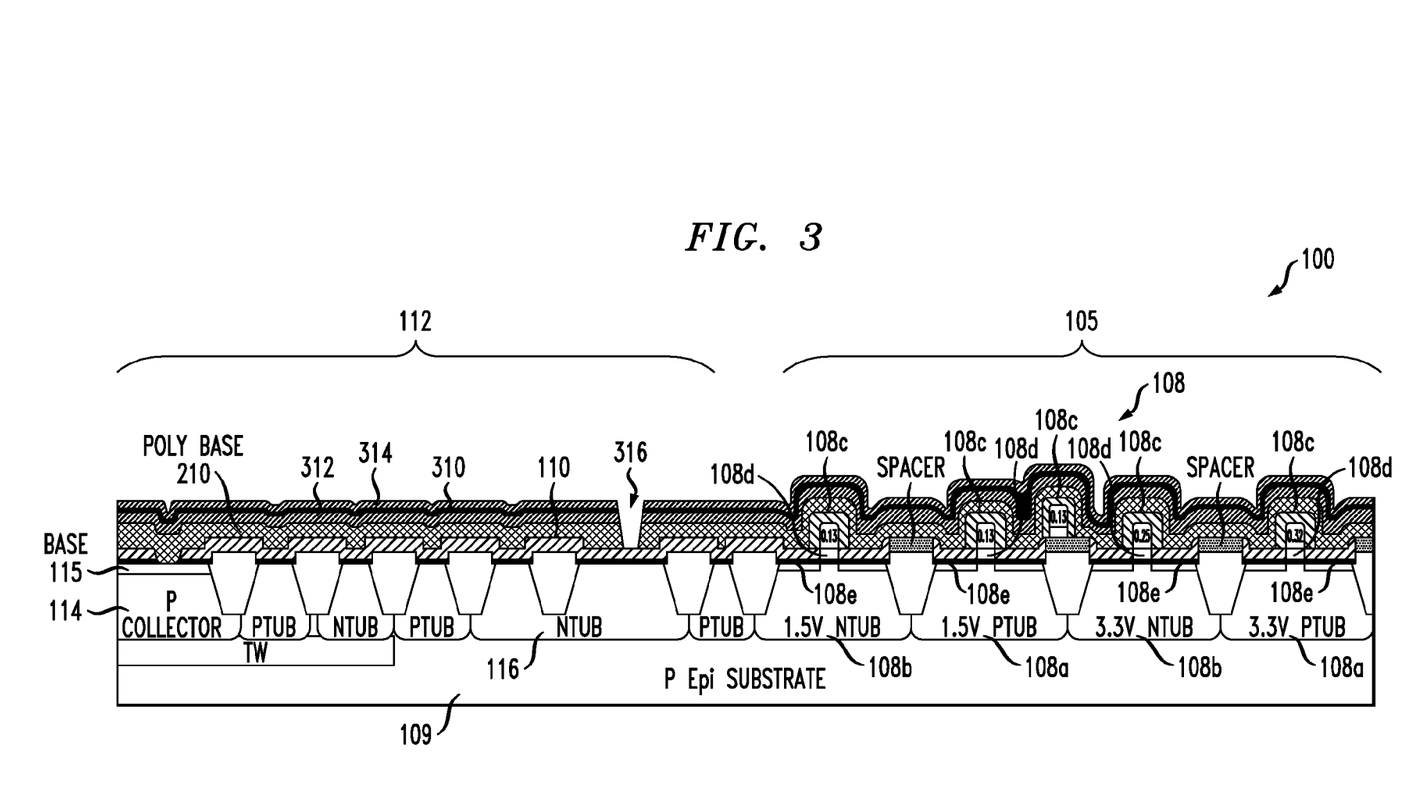

FIG. 3 shows the semiconductor device 100 of FIG. 2 after the formation of a protective layer 310. The protective layer 310 is a layer that protects non-bipolar devices during the bipolar device fabrication process so that they are not damaged or affected by those processes. In the illustrated embodiment, the protective layer 310 is located between dielectric layers 312 and 314. The dielectric layers 312 and 314 may be conventionally formed using tetra-orthosilicate as a source gas. The protective layer 310 may be a single layer or multiple layers. Additionally, the protective layer 310 has a lower hydrogen content as compared to conventional silicon nitride layers that are formed with ammonia ($NH_3$), which reduces the amount of boron penetration in the non-bipolar devices. In one embodiment, the hydrogen content of the protective layer 310 is less than about 9% by weight and is selective to silicon germanium (SiGe); that is, SiGe does not grow on the protective layer 310. These criteria are desirable in integration schemes involving the formation of both SiGe bipolar and non-bipolar devices. The lower hydrogen content is beneficial because boron penetration is reduced, and the SiGe selectivity is beneficial because the SiGe growth occurs in those regions where its growth is intended and not on other areas of the device to any effective extent.

In one embodiment, the protective layer 310 may comprise oxides, nitrides, or combinations thereof. In one specific embodiment, however, the protective layer 310 comprises one or more layers of silicon oxynitride. As seen in FIG. 3, the protective layer 310 is also deposited over the gate electrodes 108c located in the non-bipolar region 105. The protective layer 310 provides the benefit of inhibiting or reducing boron diffusion from the gate electrodes 108c and into the gate oxide layers 108d. This is particularly beneficial in non-bipolar devices where the thickness of the gate oxides 108d is less than 2.5 nm. Thus, the hydrogen content should be sufficient to inhibit or reduce boron diffusion, yet be sufficient to provide passivation of dangling bonds at the interface between the gate electrode 108c and the gate oxide 108d. Following the formation of the protective layer 310 and the dielectric layers 312, an emitter window 316 is conventionally formed to expose the underlying oxide layer 110.

Figure 4:
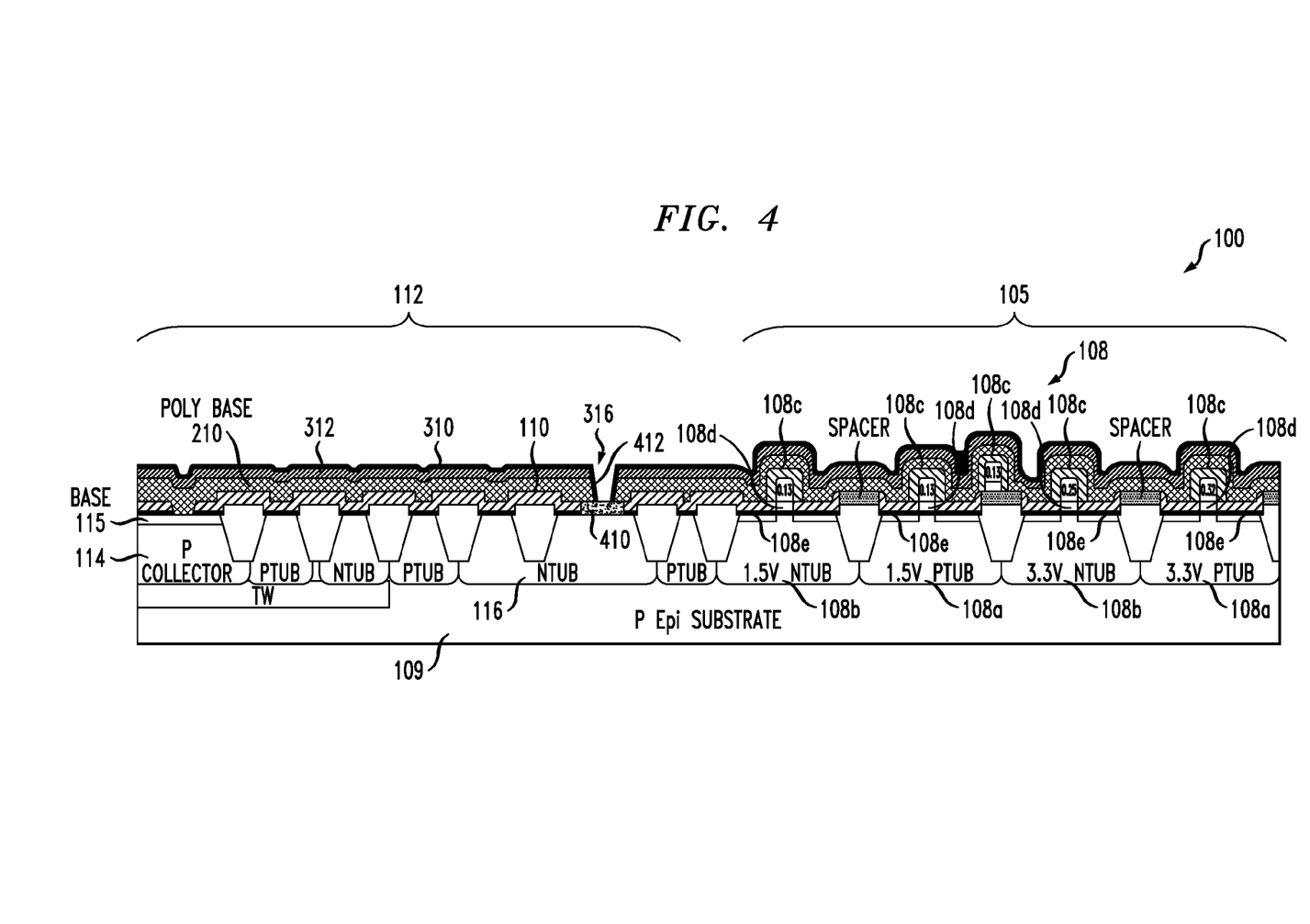

Following the formation of the emitter window 316, a conventional hydrofluoric etch is conducted to etch a cavity within the oxide layer 110. The hydrofluoric etch not only removes the oxide layer 110 exposed by the emitter window 316, it also removes dielectric layer 314. However, since the protective layer 310 is resistive to the hydrofluoric etch, only a small amount, if any, of the protective layer 310 is removed by the hydrofluoric etch. Thus, in such embodiments, the protective layer remains substantially intact. The hydrofluoric etch is followed by a conventional SiGe growth process that forms a SiGe layer 410 within the cavity, a portion of which is located under the polysilicon layer 210, as seen in FIG. 4. The SiGe growth has a relatively high thermal budget, which in conventional processes can cause the boron to diffuse from the gate electrodes 108c and into the gate oxides 108d. However, with the protective layer 310 of the invention in place, boron diffusion in inhibited or significantly reduced, which allows the threshold voltages to remain at desired levels.

The hydrofluoric etch is followed by a nitride deposition that forms nitride spacers 412 on the sides of the emitter window 316, also shown in FIG. 4. The nitride deposition may be conducted with ammonia, thereby forming a silicon nitride spacer, or it may be conducted with $N_2O$, thereby forming an oxynitride spacer.

Figure 5:
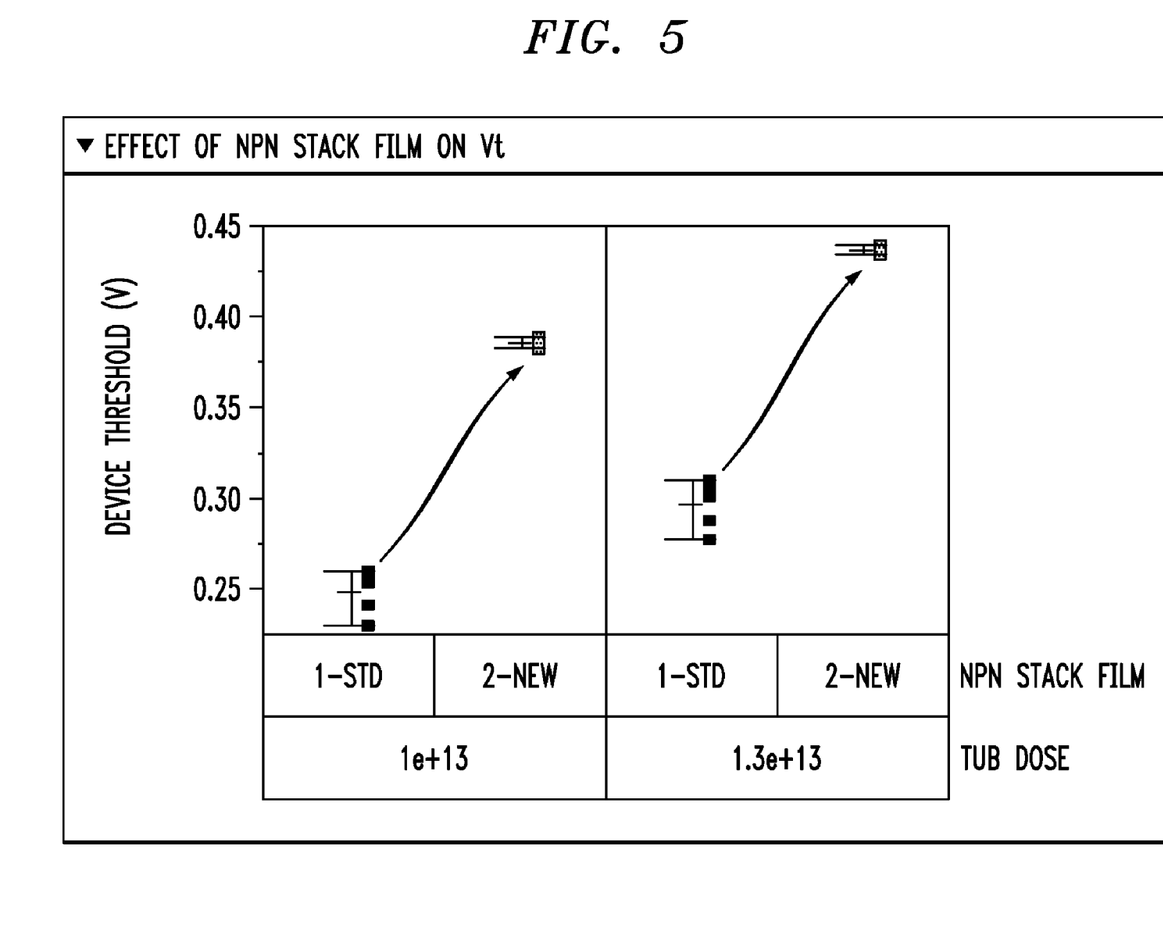
FIG. 5 illustrates a graph showing improvement in the threshold voltages of different semiconductor devices made in accordance the embodiments of FIGS. 1-4.

The benefit of the protective layer 310 as it relates to improved threshold voltage is illustrated in FIG. 5. As seen, the protective layer 310 provides a device that has significant improvement in the threshold voltage in devices formed in accordance with the various embodiments of the invention over those formed using conventional films. This result was unexpected given that the percent decrease in the amount of hydrogen from those found in conventional processes and films was relatively small (i.e. about 6% or less) when compared to the significant improvement in the threshold voltage. For example, in conventional silicon nitride films, the percent hydrogen typically ranges between 12% and 15%, while the percent hydrogen of the films utilized in the various embodiments of the invention is less than about 9%. Given, the small decrease in the hydrogen percentage, one would not expect the step function increase of the threshold voltage observed in FIG. 5.

In those embodiments where the protective layer 310 comprises a silicon oxynitride stack, plasma enhanced chemical vapor deposition processes may be used. For example, the first layer of the protective layer 310 may be formed by flowing $N_2O$ at a flow rate ranging from about 40 sccm to about 450 sccm, flowing $SiH_4$ at a flow rate ranging from about 75 sccm to about 175 sccm. The second layer may be formed by flowing $N_2O$ at a flow rate ranging from about 40 sccm to about 450 sccm, flowing $SiH_4$ at a flow rate ranging from about 75 sccm to about 175 sccm. The third layer may be formed by flowing $N_2O$ at a flow rate ranging from about 40 sccm to about 450 sccm, flowing $SiH_4$ at a flow rate ranging from about 75 sccm to about 175 sccm. These gas mixtures may be flowed with an inert gas, such as helium or argon and at a flow rate ranging from about 1500 sccm to about 3500 sccm.

Other deposition parameters include conducting the deposition at a temperature ranging from about 350° C. to about 450° C., a pressure ranging from about 3 torr to about 10 torr, and at a power ranging from about 75 watts to about 200 watts.

In one specific embodiment where the protective layer 310 comprises multiple layers of silicon oxynitride, a first layer of the protective layer 310 is formed by flowing $N_2O$ at a flow rate of 68, flowing $SiH_4$ at a flow rate of about 125 sccm and flowing an inert carrier gas at a flow rate of about 2500 sccm. A second layer of the protective layer 310 is formed by flowing $N_2O$ at a flow rate of about 270 sccm, flowing $SiH_4$ at a flow rate of about 125 sccm and flowing an inert carrier gas at a flow rate of about 2500 sccm. And, a third layer of the protective layer is formed by flowing $N_2O$ at a flow rate of about 350 sccm, flowing $SiH_4$ at a flow rate of about 125 sccm. This embodiment also includes flowing an inert carrier gas at a flow rate of about 2500 sccm conducting the deposition at a temperature of about 410° C., a pressure of about 6 torr, and at a power of about 130 watts.

Figure 6:
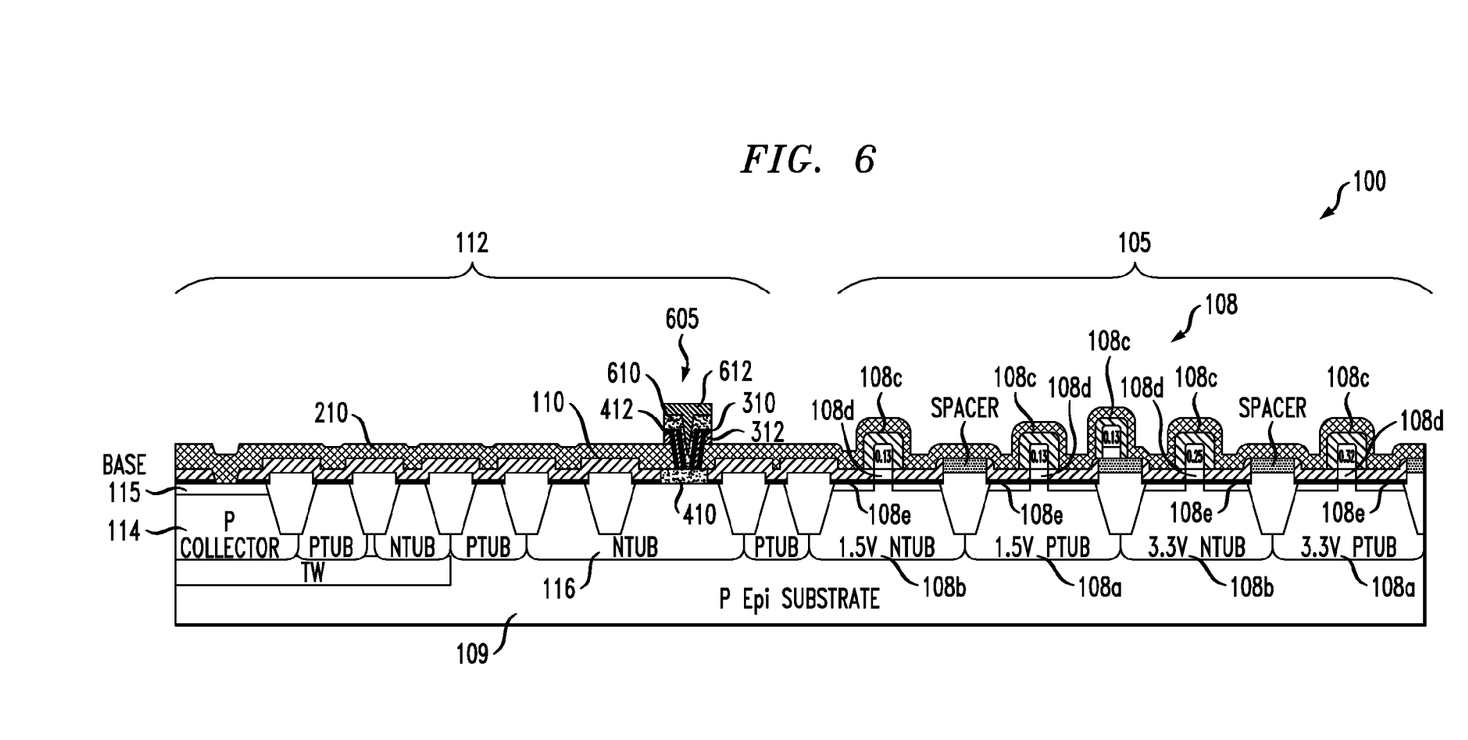
FIGS. 6-7 illustrate additional steps of forming bipolar devices and removing the protective layer.

In FIG. 6, following the formation of the SiGe layer 410 and the nitride spacers 412, conventional processes can be used to arrive at the bipolar transistor electrode 605. For example, conventional processes may be used to deposit and pattern an emitter layer 610 over the semiconductor substrate 109 and within the emitter window 316. A dielectric layer 612 may also be deposited over the emitter layer 610 and patterned using conventional processes to arrive at the bipolar transistor electrode 605. A conventional etch may be conducted to remove the protective layer 310 to arrive at the semiconductor device 100 shown in FIG. 6. At this point, conventional processes may then be used to pattern the polysilicon layer 210 and the oxide layer 110 to arrive at the structure shown in FIG. 7, which includes both the bipolar transistor electrode 605, such as an NPN bipolar transistor electrode, and bipolar transistor electrode 612, such as a PNP bipolar transistor electrode.

Figure 7:
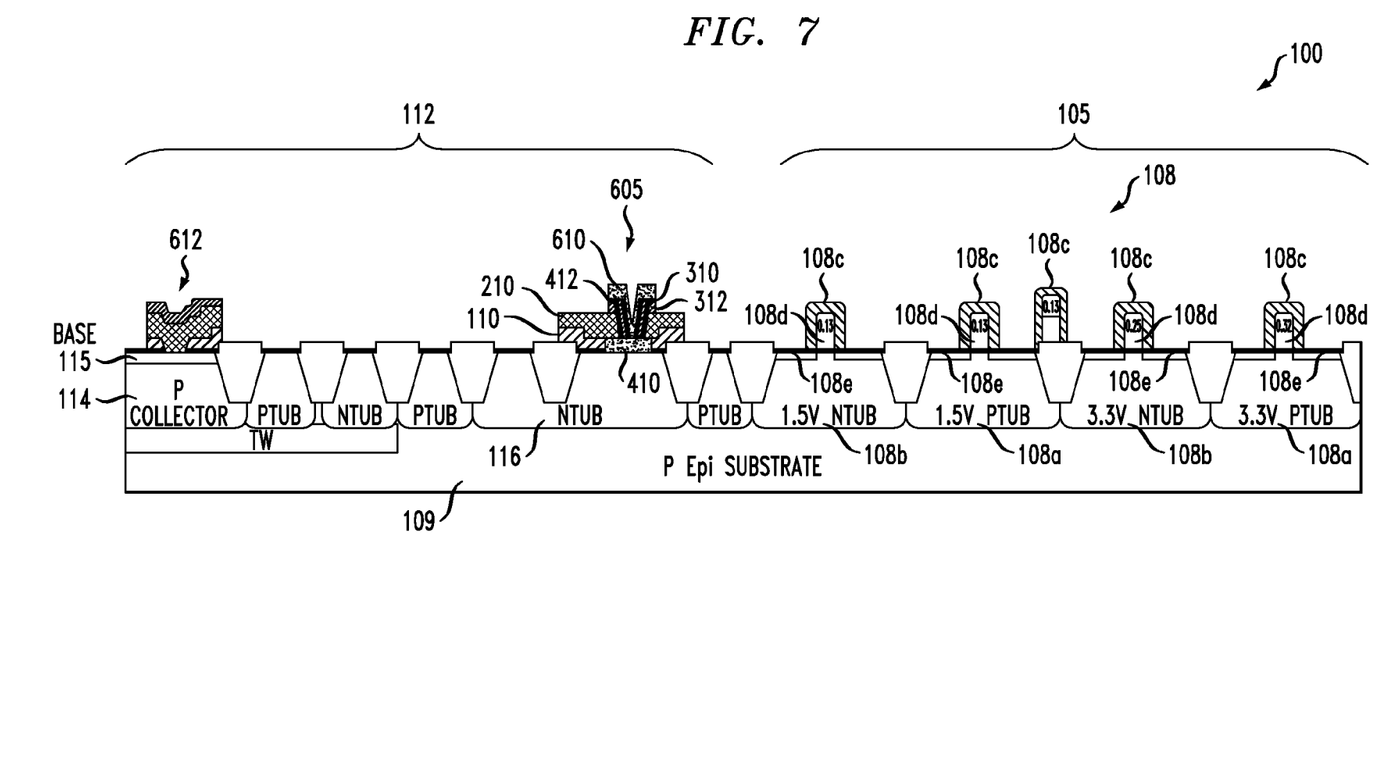
Figure 8:
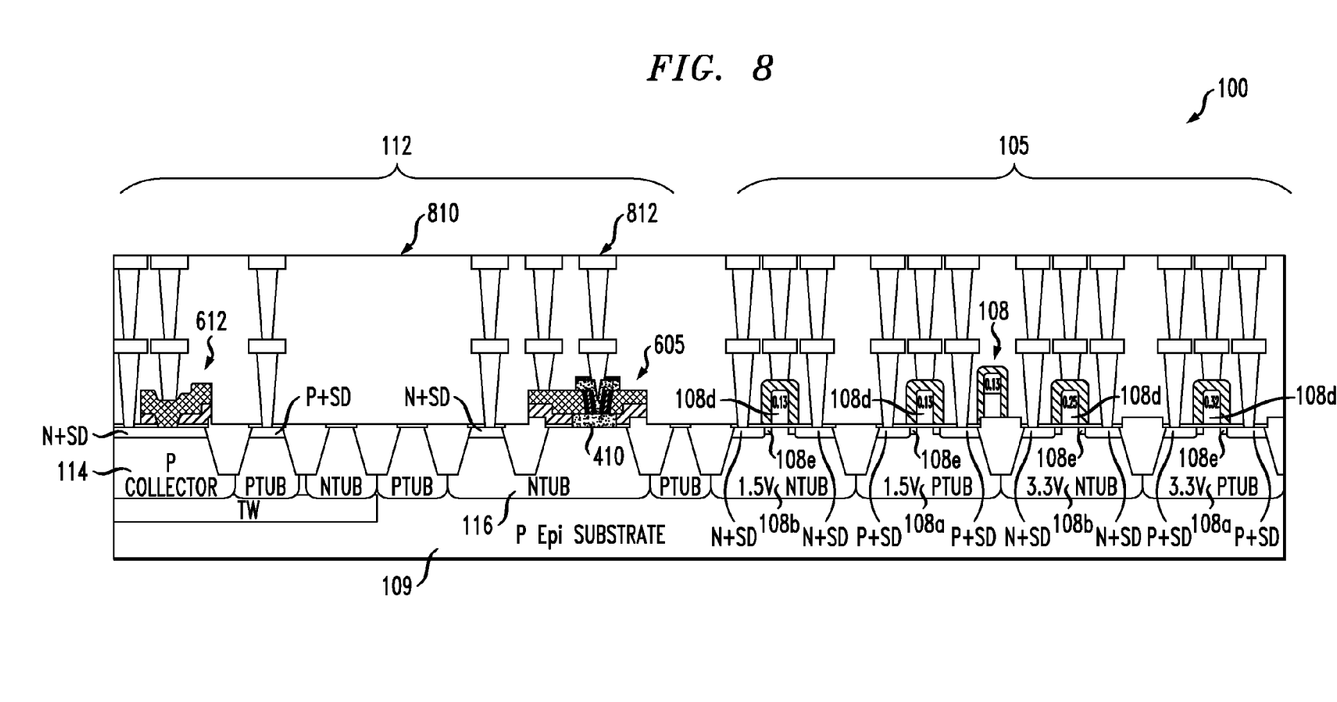
FIG. 8 illustrates a view of the bipolar device and non-bipolar transistors configured as an integrated circuit.

After the structure of FIG. 7 is achieved, conventional fabrication processes can be used to complete a semiconductor device 800, which in FIG. 8 is configured as an integrated circuit (IC). The IC device 800 includes dielectric layers 810 and interconnects 812, such as damascene or dual damascene interconnects, formed in and over the dielectric layers 810, which are located over the bipolar electrodes 605 and 612 and the non-bipolar transistors 108.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    forming gate electrodes in a non-bipolar transistor region of a semiconductor substrate;
    placing a polysilicon layer over the gate electrodes in the non-bipolar transistor region and over the semiconductor substrate within a bipolar transistor region;
    forming a protective layer over the polysilicon layer, the protective layer having a weight percent of hydrogen that is less than about 9% and is selective to silicon germanium (SiGe) deposition, such that SiGe does not form on the protective layer; and
    forming emitters for bipolar transistors in the bipolar transistor region, including forming a SiGe layer under a portion of the polysilicon layer.

2. The method recited in claim 1, wherein the protective layer is resistive to a hydrofluoric etch.

3. The method recited in claim 1, wherein the protective layer comprises oxides, nitrides or combinations thereof.

4. The method recited in claim 1, wherein the protective layer is a silicon oxynitride stack.

5. The method recited in claim 4, wherein a first layer of the protective layer is formed by a plasma enhanced chemical vapor deposition process, including flowing $N_2O$ at a flow rate ranging from about 40 sccm to about 450 sccm, flowing $SiH_4$ at a flow rate ranging from about 75 sccm to about 175 sccm and flowing an inert carrier gas at a flow rate ranging from about 1500 seem to about 3500 sccm, and at a temperature ranging from about 350° C. to about 450° C. and a pressure ranging from about 3 torr to about 10 torr and wherein the deposition is conducted at a power ranging from about 75 watts to about 200 watts.

6. The method recited in claim 4, wherein a second layer of the protective layer is formed by a plasma enhanced chemical vapor deposition process, including flowing $N_2O$ at a flow rate ranging from about 40 sccm to about 450 sccm, flowing $SiH_4$ at a flow rate ranging from about 75 sccm to about 175 sccm and flowing an inert carrier gas at a flow rate ranging from about 1500 sccm to about 3500 sccm, and at a temperature ranging from about 350° C. to about 450° C. and a pressure ranging from about 3 torr to about 10 torr and wherein the deposition is conducted at a power ranging from about 75 watts to about 200 watts.

7. The method recited in claim 4, wherein a third layer of the protective layer is formed by a plasma enhanced chemical vapor deposition process, including flowing $N_2O$ at a flow rate ranging from about 40 sccm to about 450 sccm, flowing $SiH_4$ at a flow rate ranging from about 75 sccm to about 175 sccm and flowing an inert carrier gas at a flow rate ranging from about 1500 seem to about 3500 sccm, and at a temperature ranging from about 350° C. to about 450° C. and a pressure ranging from about 3 torr to about 10 torr and wherein the deposition is conducted at a power ranging from about 75 watts to about 200 watts.

8. The method recited in claim 1, wherein the semiconductor device is an integrated circuit and the gate electrodes form a part of non-bipolar transistors and the method further includes forming dielectric layers over the non-bipolar transistors and the bipolar transistors and forming interconnects over and within the dielectric layer to interconnect the bipolar transistors and the non-bipolar transistors.

9. A method of manufacturing a semiconductor device, comprising:
    forming gate electrodes in a non-bipolar transistor region and over a semiconductor substrate;
    placing a polysilicon layer over the gate electrodes in the non-bipolar transistor region and over a bipolar transistor region of the semiconductor substrate;
    forming a dielectric layer over the polysilicon layer;
    forming a protective layer over the polysilicon layer, the protective layer having a weight percent of hydrogen that is less than about 9%, wherein the protective layer is selective to silicon germanium (SiGe) deposition, such that SiGe does not form on the protective layer;

forming a silicon/germanium (Si/Ge) layer over a collector tub and under a portion of the polysilicon layer within the bipolar transistor region;

forming an emitter layer for bipolar transistors in the bipolar transistor region and over the protective layer and the Si/Ge layer;

patterning the dielectric layer, the protective layer and the emitter layer, including removing the protective layer from the non-bipolar transistor region; and patterning the polysilicon layer.

10. The method recited in claim 9, wherein the protective layer is resistive to a hydrofluoric clean.

11. The method recited in claim 9, wherein the protective layer comprises silicon oxynitride.

12. The method recited in claim 11, wherein:

a first layer of the protective layer is formed by a plasma enhanced chemical vapor deposition process, including flowing $N_2O$ at a flow rate of 68, flowing $SiH_4$ at a flow rate of about 125 sccm and flowing an inert carrier gas at a flow rate of about 2500 sccm;

a second layer of the protective layer is formed by a plasma enhanced chemical vapor deposition process, including flowing $N_2O$ at a flow rate of about 270 sccm, flowing $SiH_4$ at a flow rate of about 125 sccm and flowing an inert carrier gas at a flow rate of about 2500 sccm; and a third layer of the protective layer is formed by a plasma enhanced chemical vapor deposition process, including flowing $N_2O$ at a flow rate of about 350 sccm, flowing $SiH_4$ at a flow rate of about 125 sccm and flowing an inert carrier gas at a flow rate of about 2500 sccm, and wherein the protective layer is formed at a temperature of about 410° C., a pressure of about 6 torr, and at a power of about 130 watts.

13. The method recited in claim 9, wherein the semiconductor device is an integrated circuit and the gate electrodes form a part of non-bipolar transistors and the method further includes forming dielectric layers over the non-bipolar transistors and the bipolar transistors and forming interconnects over and within the dielectric layer to interconnect the bipolar transistors and the non-bipolar transistors.

* * * * *